US007090958B2

(12) United States Patent
Jones et al.

(10) Patent No.: US 7,090,958 B2
(45) Date of Patent: Aug. 15, 2006

(54) POSITIVE PHOTORESIST COMPOSITIONS HAVING ENHANCED PROCESSING TIME

(75) Inventors: James E. Jones, Butler, PA (US); Randal L. Campbell, New Alexandria, PA (US); David A. Diehl, Pittsburgh, PA (US); Ljiljana Maksimovic, Allison Park, PA (US); Ronald R. Ambrose, Pittsburgh, PA (US); Gerald W. Gruber, Mars, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 10/411,899

(22) Filed: Apr. 11, 2003

(65) Prior Publication Data

US 2004/0202953 A1    Oct. 14, 2004

(51) Int. Cl.
G03F 7/023 (2006.01)
G03F 7/30 (2006.01)

(52) U.S. Cl. ............... 430/192; 430/193; 430/270.1; 430/326; 430/905; 430/906

(58) Field of Classification Search ........... 430/189, 430/190, 192, 193, 270.1, 326, 905, 910, 430/191, 906
See application file for complete search history.

(56) References Cited

U.S. PATENT DOCUMENTS

| 3,046,110 | A | | 7/1962 | Schmidt | 96/33 |
|---|---|---|---|---|---|
| 3,106,465 | A | | 10/1963 | Neugebauer et al. | 96/33 |
| 3,148,983 | A | | 9/1964 | Endermann et al. | 96/33 |
| 3,180,733 | A | | 4/1965 | Neugebauer et al. | 96/33 |
| 3,188,210 | A | | 6/1965 | Fritz et al. | 96/33 |
| 3,849,137 | A | * | 11/1974 | Barzynski et al. | 430/281.1 |
| 3,991,033 | A | * | 11/1976 | Sam | 525/398 |
| 4,366,224 | A | | 12/1982 | Hsieh | 430/149 |
| 4,456,679 | A | * | 6/1984 | Leyrer et al. | 430/326 |
| 4,632,900 | A | * | 12/1986 | Demmer et al. | 430/323 |
| 5,064,746 | A | * | 11/1991 | Schwalm | 430/270.1 |
| 5,230,984 | A | | 7/1993 | Tachiki et al. | 430/270 |
| 5,232,815 | A | * | 8/1993 | Browne et al. | 430/191 |
| 5,324,620 | A | * | 6/1994 | Ebersole | 430/192 |
| 5,508,141 | A | * | 4/1996 | Hart et al. | 430/191 |
| 5,600,035 | A | * | 2/1997 | Kahle et al. | 568/932 |
| 5,707,777 | A | * | 1/1998 | Aoai et al. | 430/270.1 |
| 5,733,479 | A | * | 3/1998 | Kahle et al. | 252/405 |
| 5,847,218 | A | | 12/1998 | Ohsawa et al. | 564/430 |
| 5,851,727 | A | | 12/1998 | Choi et al. | 430/270.1 |
| 6,100,008 | A | | 8/2000 | McMurdie | 430/270.1 |
| 6,136,504 | A | | 10/2000 | Tan et al. | 430/270.1 |
| 6,376,152 | B1 | | 4/2002 | Kawabe et al. | 430/270.1 |
| 6,506,535 | B1 | | 1/2003 | Mizutani et al. | 430/270.1 |
| 6,528,229 | B1 | | 3/2003 | Sato | 430/170 |
| 6,528,232 | B1 | | 3/2003 | Maeda et al. | 430/270.1 |
| 2001/0041299 | A1 | * | 11/2001 | Fujita et al. | 430/165 |

FOREIGN PATENT DOCUMENTS

| JP | 62069263 | 3/1987 |
|---|---|---|
| JP | 06003828 | 1/1994 |
| JP | 2001154354 | 6/2001 |
| JP | 2001261825 | 9/2001 |

* cited by examiner

Primary Examiner—John S. Chu
(74) Attorney, Agent, or Firm—Diane R. Meyers; Donald R. Meyers; Donald R. Palladino

(57) ABSTRACT

Novel compositions comprising photoactive polymers comprising a dinitrobenzyl group in conjunction with a photoacid generator are disclosed. In one embodiment, the photoacid generator is a diazide and/or a sulfonyl aceto carbonyl compound. The photoacid generators are typically used in amounts of 10 weight percent or less. The compositions find particular application in storage stable, pH stable, and water stable positive photoresist compositions. Such compositions demonstrate reduced process time as compared with similar compositions lacking the photoacid generator. Methods for using these compositions are also disclosed.

24 Claims, No Drawings

POSITIVE PHOTORESIST COMPOSITIONS HAVING ENHANCED PROCESSING TIME

FIELD OF THE INVENTION

The present invention relates generally to positive photoresist compositions that have enhanced processing times. More specifically, the compositions comprise dinitrobenzyl compounds to which has been added a photoacid generator.

BACKGROUND INFORMATION

Processes for forming resist patterns on the surfaces of substrates typically comprise forming a photo-sensitive layer on the surface of the substrate, irradiating portions of the photo-sensitive layer with actinic light, and developing the irradiated layer. If the solubilization of the photoresist increases when exposed to actinic light, it is referred to as a "positive-acting" photoresist; the relatively high molecular weight positive-acting photoresist material depolymerizes, or undergoes breakage of the polymer bonds, upon exposure to actinic radiation thereby rendering the treated compound more easily dissolved by developing solution. If the solubilization of the photoresist decreases when exposed to actinic radiation, it is referred to as a "negative-acting" photoresist; the relatively low molecular weight negative-acting material crosslinks upon exposure to actinic radiation and, thus, it is the non-treated compound that dissolves upon exposure to the developing solution.

Photoresists are often used to protect the underlying substrate from the effects of a subsequent etching process. Defects in the resist pattern, such as inadequate coverage over certain parts of the substrate or inadequate development of the irradiated layer, can result in problems in the completed product. Accordingly, it is important to employ a photoresist whose irradiated layer can adequately be developed and that forms a uniform layer over all surfaces of the substrate to be protected Photoreactive polymers are particularly useful as binder resins in photoresist compositions employed in photodevelopment of electronic components such as circuit boards and other products. Positive-acting resists have certain advantages in the manufacture of circuit boards; defects that will occur in the manufacture of circuit boards are easier to repair when positive-acting resists are used as compared to when negative-acting resists are used. The irradiation of the photoresist, in the case of circuit board manufacture, often occurs through a glass or plastic cover sheet. The use of "masks" or "art work" prevents exposure of desired areas of the photoresist to UV light.

SUMMARY OF THE INVENTION

The present invention is generally directed to compositions useful as positive photoactive compounds. The compositions generally comprise a photoactive polymer and a photoacid generator. The photopolymer is one that comprises a dinitrobenzyl group. The photoacid generator can be either mixed with the photoactive polymer, or can actually be copolymerized with the photoactive polymer. Methods for decreasing clear time using these compositions are also within the scope of the present invention.

A positive photoresist, as discussed above, is a relatively high molecular weight composition, such as a polymer, that depolymerizes upon exposure to actinic radiation. The polymer bonds break thereby reducing the overall molecular weight of the composition. The positive photoresist composition that is exposed to actinic radiation is therefore more easily dissolved by a developing solution. In this manner, the portion of the composition that has been exposed to actinic radiation is removed. Positive-acting photoresists are often preferred in certain applications, such as in the manufacture of circuit boards. The surface characteristics of positive photoresists are often superior to negative photoresists, with fewer mechanical defects. In addition, positive acting photoresists often handle better than their negative counterparts. The energy needed to break bonds in the case of positive photoresists, however, is typically much higher than the energy needed to form bonds or promote crosslinking in the case of negative photoresists; this increased energy requirement typically necessitates a longer exposure time to the light source. Moreover, positive photoresists can often have a longer processing time than negative photoresists. Thus, a longer manufacturing time per piece is often encountered when using positive photoresists as compared to negative.

The present invention provides positive photoresists that have enhanced processing times. "Processing time", "process time", and like terms refer to the amount of time the photoresist is exposed to actinic radiation ("exposure time") plus the amount of time that it takes to clear away the photoresist following exposure ("clear time"). Thus, the present invention allows for decreasing the exposure time and/or clear time. As can be appreciated, faster process times are more efficient.

In addition to decreasing process times, the present compositions overcome other shortcomings seen with positive photoresists used in the art. For example, several photoresist compounds are known to have problems with storage stability. Other compounds have sensitivity to water and/or extreme pH conditions; such high and low pH can cause yet other compounds to undergo hydrolysis. The present compositions, in contrast, are storage stable and relatively unaffected by changes in pH.

It will be appreciated that the present compositions achieve faster process times through the addition of a photoacid generator. In one embodiment, this generator is a diazide. The term "diazide" will be understood as referring to diazo compounds that are photochemically activated to generate carboxylic acids. One class of compounds used are diazonaphthoquinones. While the use of diazides as positive photoresists has been reported, the diazide typically predominates in these formulations; that is, the diazide is the primary "resin" or polymer in the compositions. It is the diazide alone that provides the photo-sensitive group to these photoresists. In contrast, the present compositions utilize a photoreactive polymer, such as one that contains a dinitrobenzyl group, in conjunction with the photoacid generator. It has been surprisingly discovered that the photoacid generator need only be included in relatively small amounts, i.e. 10 weight percent (based on solids) or less, to achieve faster process times. Thus, the photoacid generators of the present compositions are more akin to additives. Because the amount of photoacid generator is relative small, many of the shortcomings observed in the art with other photoresists are overcome by the present invention.

In addition, diazonapthoquinone photoacid generators react with light to form ketenes, which need water for subsequent reaction to generate the photoacid; this typically adds another processing step. In the present invention, this additional step is not needed.

DETAILED DESCRIPTION OF THE INVENTION

The present invention is directed to compositions comprising a photoactive polymer comprising a dinitrobenzyl group and a photoacid generator. The compositions find particular application as positive photoresists.

A photoactive polymer comprising a dinitrobenzyl group, according to the present invention, is a photoreactive compound synthesized from monomers including those having the structure of formula (I):

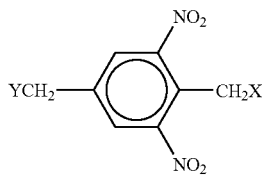

or formula (II):

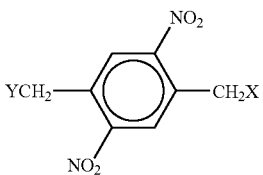

where X and Y may be the same or different and are selected from halogen, —OH, —OR, —O—$SO_3$R, —SR, and —NRR'. R and R' may be any of a wide variety of organic substituents, including substituted or unsubstituted alkyl, aryl, or aralkyl substituents; if further reaction is desired, the R or R' groups may include a reactive group such as a hydroxyl group. A particularly suitable embodiment includes a compound having the structure of formula I wherein X and Y are the same or different and are either halogen or hydroxy groups. Photoactive polymers comprising dinitrobenzyl groups, and methods for synthesizing such polymers, are described in U.S. Pat. No. 5,600,035, the contents of which are hereby incorporated by reference. Photoactive polymers comprising a dinitrobenzyl group are commercially available from PPG Industries, Inc. in the LIQUIDIMAGE PLUS line.

In some embodiments of the present invention, the composition does not include a dissolution inhibitor. Dissolution inhibitors are sometimes added to positive photoresist compositions to inhibit dissolution of unexposed polymer and/or promote dissolution in areas where the polymer is exposed to actinic radiation. Dissolution inhibitors do not generate acid upon exposure to radiation, and are therefore distinct from the photoacid generators used according to the present invention. In other embodiments, however, the presence of the dissolution inhibitor may actually help to improve the quality of the final product.

The photoacid generators used in the present invention include those compounds that generate an acid when exposed to actinic light and that decrease process time in a positive photoresist. One skilled in the art can determine whether a compound generates an acid when exposed to actinic light by analyzing for acid content following exposure to actinic light, such as by titration or other standard methods. Whether process time is decreased by such a compound can be determined by adding the compound to a positive photoresist formulation comprising a dinitrobenzyl group and comparing the clear time of the photoresist compound both with and without the photoacid generator. In one embodiment, the photoacid generators of the present invention are those that have optimum absorbance in the 315 to 400 nm range.

Examples of photoacid generators within the present invention include but are not limited to phosphonium salts, sulfonium salts, diazonium salts and iodonium salts, oxazole derivatives, sulfonyl aceto carbonyl compounds, and the like. Such compounds are further described in U.S. Pat. No. 5,230,984, hereby incorporated by reference. A particularly suitable sulfonyl aceto carbonyl compound is 2-(phenylsulfonyl) acetophenone. A particular class of suitable photoacid generators include the diazides. Examples of diazides include, but are not limited to, 2,2'bis[naphthoquinone-(1,2)-diazide-(2)-sulfonylhydroxy-(5)]-dinaphthyl-(1,1')-methane; 2,3-bis[naphthoquinone-(1,2)diazide-2(2)-sulfonylhydroxy-(5)]-dihydroxybenzophenone; ester of naphthoquinone-(1,2)-diazide-(2)-sulfonic acid-(5) and 1,2, 3-trihydroxybenzophenone; naphthoquinone-(1,2)-diazide-(4) sulfonic acid chloride; naphthoquinone-(1,2)-diazide-(2)-sulfonylhydroxy-(4)-phenylcumene; and the monoester of 2-diazo-1-naphthol-5-sulfonic acid with bisphenol-A. Other diazides include those disclosed in U.S. Pat. Nos. 3,046,110 through U.S. Pat. Nos. 3,046,119; 3,046,121; 3,046,124; 3,106,465; 3,148,983; 3,180,733; and 3,188,210, all of which are also incorporated by reference herein.

In one embodiment, the photoacid generator is mixed in with the photoactive polymer. For example, the photoacid generator can be dissolved in a solvent if necessary, such as water or an organic solvent, and then mixed with the photoactive polymer, which is already formed. Alternatively, the photoacid generator can be solubilized, if necessary, and charged to the reactor with the other monomers of the photoactive polymer.

In yet another embodiment, the photoacid generator is actually copolymerized with the photopolymer. In this embodiment, it may be necessary to modify the photoacid generator so as to make it reactive with the other photoactive polymer components. For example, the photoacid generator can be converted to a diol through any means known in the art and reacted with the other monomers of the photoactive polymer in a standard polymerization reaction.

Significantly, the incorporation of a photoacid generator into a photoactive polymer according to the present invention, regardless of whether it is merely admixed with the polymer or made a part thereof, does not interfere with the photoreactive properties of the polymer. The resulting composition still has properties desirable for use in a positive photoresist, and gives excellent performance as a positive photoresist. The process time, however, will be reduced, sometimes by as much as 50 percent.

As noted above, the photoacid generator is used in relatively small quantities in the present compositions. By "relatively small" is meant 10 weight percent or less of the composition based on solid weight. In one embodiment, the photoacid generator comprises 6 weight percent or less of the total composition. Thus, another embodiment of the present invention is directed to a composition comprising a positive-acting photoactive polymer and a diazide and/or sulfonyl aceto carbonyl compound, wherein the diazide comprises 10 weight percent or less, or 5 weight percent or less or even 2 weight percent or less of the composition, again with weight percent being based on total solid weight, or 5 weight percent or less or even 2 weight percent or less. When diazide is used in this embodiment, the photoactive polymer does not comprise polyamide and/or polyimide. A photoactive polymer will be understood by those skilled in the art as one that undergoes a change in solubility when exposed to light; this includes but is not limited to the dinitrobenzyl-containing polymers described above. One can easily determine whether a polymer undergoes such a change in solubility by immersing an exposed and unexposed sample of the polymer in a developing solution and comparing the clear time for each.

The present invention is further directed to a method for reducing process time in a positive photoresist by using the compositions of the present invention in the photoresist formulation. The photoresist can be applied to any suitable substrate. Examples include wood, paper, particle board, chipboard, metals, metals having primers, glass, plastics, and metallized plastics. The coated substrates have a variety of applications, such as in the chemical milling industry, lead frame manufacturing, manufacture of aperture screens, the printing plate industry and especially the circuit board industry. The photoresist can be applied to the substrate by any known means, such as brushing, dipping, roll coating, doctor blade coating, spraying, curtain coating, and electrodeposition. Such methods are standard practice in the various arts in which the photoresists find application.

Following application of a photoresist, the substrate comprising the photoresist, which can be on either or both sides, is typically placed beneath a mask either on one or both sides. The mask will typically be a material through which actinic radiation will passe such as Mylar, glass, quartz and the like, to which is applied a pattern through which actinic radiation will not pass. Often, a vacuum will be applied to draw the mask or masks into intimate contact with the photoresist. The photoresist is then treated with actinic radiation, such as from a UV lamp, at a dosage sufficient to effect the treatment of the photoresist. "Treatment" and like terms refer to exposure to actinic radiation so as to effect depolymerization of the photoresist material, which increases solubilization of the photoresist.

Any form of actinic radiation can be used according to the present invention. As noted above, a particularly suitable source is UV radiation. An iron-doped metal halide lamp is particularly suitable, as it emits UV light in wavelengths particularly suitable for certain embodiments of the present invention, such as those wherein a dinitrobenzyl group is present in the photoactive polymer and the photoacid generator is a diazide or sulfonyl aceto carbonyl compound. Metal halide lamps doped with other compounds, as well as mercury lamps and electrodeless UV lamps, are also suitable. Such lamps are commercially available, for example, from UV Light Technology Ltd., Birmingham, England; E.C.S., Inc., Washington, N.J.; and Fusion UV Systems, Inc., Gaithersburg, Md. It will be appreciated that UV light is in the range of approximately 100 to 450 nanometers ("nm"). The wavelengths above about 315 nm are especially suitable for treating photoresists prepared using the compositions of the present invention.

The dosage at which treatment of the photoresist is effected can vary depending on the particular photoresist used, the thickness of the photoresist, and the substrate to which the photoresist is applied. "Dosage" or "photo speed" refers to the amount of actinic radiation required to effect treatment of the photoresist film. Dosage is typically expressed in milliJoules per centimeter$^2$ (mJ/cm$^2$). Suitable dosages when treating LIQUIDIMAGE PLUS compositions without the present photoacid generators when applied at a dry film thickness of about 0.2 to 0.3 mils are typically about 400 mJ/cm$^2$+/−25 percent, or about 400 mJ/cm$^2$+/−10 percent, as measured with a Model 87 digital radiometer, Standard Probe 320–380, commercially obtained from EIS, Tukwila, Wash. It will be appreciated that dosages measured with equipment from other manufacturers—even with digital radiometers using the same type of probe—can be significantly different than the values achieved with the EIS product. It will be further appreciated that the dosage given above is that to which the photoresist itself is exposed. Some artwork or masks made of Mylar or other materials will absorb some of the UV radiation, as will print frames made of glass or glass and plastic. These factors should be accounted for when determining how to administer the appropriate dosage. Thickness of the photoresist should also be considered, as a thicker coating will typically require a higher dosage of radiation. The appropriate dosage to use for a given application will be readily apparent to those skilled in the art.

The dosage needed to effect treatment results from administration of a particular intensity of light for a particular length of time. It is an advantage of the present invention that a reduced dosage of about 300 mJ/cm$^2$ or lower, such as 250 mJ/cm$^2$ to 200 mJ/cm$^2$, all +/−25 percent, can produce the equivalent functional properties of the control LIQUIDIMAGE PLUS system without a photoacid generator; as noted above, this control typically requires a dosage of about 400 mJ/cm$^2$. Reductions of process time between 25 and 50 percent can be achieved. Thus, exposure time and therefore process time is reduced by use of the present compositions.

It will further be appreciated that the distance between the light and the photoresist is related to the intensity, as set forth in The Inverse Square law: intensity is inversely proportional to (distance of light)$^2$. Thus, the distance at which the source of actinic radiation is placed in relation to the photoresist composition should be taken into account when calculating the desired dosage and intensity. The appropriate distance between the actinic radiation source and the photoresist composition can be determined by one skilled in the art.

It will be appreciated that the parameters discussed above will vary depending on the photoresist being used, its thickness, and the application. Generally, the photoresist composition should be uniformly exposed to the actinic radiation.

After irradiation and removal of the photomask, the photoresist film is developed. Development of the photoresist film entails subjecting it to a developing solution by spraying, dipping, or the like. Any developing solution known in the art can be used. For example, a basic aqueous solution can be used for polymeric materials, such as KOH, NaOH, $K_2CO_3$ or $Na_2CO_3$ solutions.

Usually, the photoresist film is developed at a temperature between 0 and 180° F. over a period of between about ten seconds and ten minutes. The concentration of the base in the developing solution can be between about 0.05 and 20 weight percent in water. The exposed areas of a positive photoresist become solubilized, i.e. more soluble to a developing solution. Thus, there is a solubility differential between the exposed and unexposed areas of the photoresist film, and the developing solution removes the exposed areas. It is typically desired that this difference in solubility be great enough that exposure of the unexposed photoresist to the developing solution does not result in appreciable loss.

Less than 10 percent loss of unexposed photoresist following four times the clear time in the developing solution (4×UFL) is typically desired. The present compositions achieve this.

Because different radiometers can give very divergent dosage readings, the circuit board industry has established the Stouffer Step Tablet ("SST") for standardization purposes. SST is a 21-step gray scale that will provide image quality results that can be compared regardless of the developer used, the radiometer used, etc. For positive photoresists, a clear value of about 3 to 5 is typically desired. The present methods can achieve these parameters. Moreover, as noted above, clear values in this range can be achieved in shorter amounts of time as compared with photoresists lacking the photoacid generator described herein.

As used herein, unless otherwise expressly specified all numbers such as those expressing values, ranges, amounts or percentages may be read as if prefaced by the word "about", even if the term does not expressly appear. Any numerical range recited herein is intended to include all sub-ranges subsumed therein. Plural encompasses singular and vice versa. Accordingly, it should be understood that mixtures of photoactive polymers and/or mixtures of photoacid generators, as well as mixtures of any other components described herein, are within the scope of the present invention. Also, as used herein, the term "polymer" is meant to refer to oligomers and both homopolymers and copolymers; the prefix "poly" refers to two or more.

EXAMPLES

The following examples are intended to illustrate the invention, and should not be construed as limiting the invention in any way.

Example 1

LIQUIDIMAGE PLUS, a positive photoresist commercially available from PPG Industries, Inc., was used as a control. LIQUIDIMAGE PLUS was mixed with 2-diazo-1-naphthol-4-sulfonic acid, sodium salt ("DNQ") compounds that had been dissolved in DMSO. A 1 percent DNQ solution, 3 percent DNQ solution and 6 percent DNQ solution were prepared and added, respectively, to Samples 1–3 by mixing 1.1, 3.2 or 6.2 grams, respectively, of the appropriate 30 percent DNQ/DMSO solution, which had been prepared by adding 5 grams of DNQ to 10 grams DMSO, with 100 grams of LIQUIDIMAGE PLUS (32% solution). For Sample 4, 4.1 grams of DMSO were mixed with 100 grams of the LIQUIDIMAGE PLUS (32% solution).

The control and Samples 1–4 were applied to separate sheets of copper laminate using #14 wirewound draw-down bar. After two minutes of a room temperature flash, and a six minute bake at 125° C., a dry film thickness of 0.2 mil was obtained. The coated laminates were exposed to a dosage of 400 mJ/cm$^2$ UV light from a Colight 1630 iron doped mercury halide lamp, from E.C.S. Inc. through a Mylar mask. The images were developed by being immersed in a 1.5 percent NaOH solution at 40° C. until the clear time was observed. Results are presented in Table 1. The results presented in Table 2 were obtained in a similar manner, only following exposure using 200 mJ/cm$^2$ UV light. Both tables report the clear time in seconds and the SST rating, which was measured at two times the control clear time.

TABLE 1

| Sample | Modification | Clear Time | SST-rating |
|---|---|---|---|
| Control | No DNQ | 18 | 3 |
| 1 | 1% DNQ | 17 | 3 |
| 2 | 3% DNQ | 10 | 5 |
| 3 | 6% DNQ | 19 | 3 |
| 4 | 35% DMSO | 19 | 2.5 |

TABLE 2

| Sample | Modification | Clear Time | SST-rating |
|---|---|---|---|
| Control | No | 40 | 4 |
| 1 | 1% DNQ | 38 | 4 |
| 2 | 3% DNQ | 25 | 6.5 |
| 3 | 6% DNQ | 19 | 4 |
| 4 | 12% DMSO | 42 | 3 |

As illustrated in Table 1, use of 1 percent and 3 percent DNQ solutions improved clear time, and gave a good SST rating. Similar results were also seen when using 200 mJ/cm$^2$ UV light, as shown in Table 2, although at this dosage the use of the 6 percent DNQ solution also greatly reduced clear time. Some crystallization of the DNQ was seen at the 6 percent level at both dosages.

Example 2

A LIQUIDIMAGE PLUS formulation was prepared as generally taught in U.S. Pat. No. 6,100,008 but without the bis-t-butyl phenylether dissolution inhibitor typically used. To this formulation was added the various additive(s) shown in Table 3. The samples were applied to copper laminate and tested in the manner generally described in Example 1. Film loss in unexposed areas after exposure to the NaOH solution for four times the clear time were also measured (4×UFL). A 4×UFL of 10 percent or lower is typically desired. Results are also shown in Table 3.

TABLE 3

| Sample | Additive | Wt % of additive based on total solid weight | Clear time (sec) for 400 mJ exposure | Clear time (sec) for 200 mJ exposure | Copper appearance after clear time | 4 × UFL (%) |
|---|---|---|---|---|---|---|
| 5 | bis-t-butyl phenylether | 2 | 14 | 30 | Clear | 3.78 |
| 6 | 2-(phenylsulfonyl)[1] acetophenone | 2 | 12 | 30 | Clear | 5.93 |

TABLE 3-continued

| Sample | Additive | Wt % of additive based on total solid weight | Clear time (sec) for 400 mJ exposure | Clear time (sec) for 200 mJ exposure | Copper appearance after clear time | 4 × UFL (%) |
|---|---|---|---|---|---|---|
| 7 | 2-(phenylsulfonyl) acetophenone | 5 | 10 | 20 | Clear | 6.05 |
| 8 | 2-(phenylsulfonyl) acetophenone | 10 | 9 | 17 | Clear | 11.14 |
| 9 | monoester of 2-diazo-1-naphthol-5-sulfonic acid with Bisphenol A | 2 | 13 | 25 | Discolored | 4.57 |
| 10 | monoester of 2-diazo-1-naphthol-5-sulfonic acid with Bisphenol A | 5 | 11 | 25 | Discolored | 5.43 |
| 11 | monoester of 2-diazo-1-naphthol-5-sulfonic acid with Bisphenol A[2] | 10 | 11 | 40 | Discolored | 6.80 |

[1]Obtained from Aldrich.
[2]Obtained from Secant Chemical as SCL 5.

As shown in Table 3, Samples 6–8 with the 2-(phenylsulfonyl) acetophenone additive reduced clear time and gave good 4×UFL values. Samples 9–11 also had reduced clear time and good 4×UFL values although when the copper dried it was slightly discolored. It is unknown whether this discoloration was caused by residual polymer, staining, or some other mechanism.

Example 3

Assuming that a maximum development time of 60 seconds is practical in a production environment, films of several compositions deposited onto copper substrates as described above were exposed with a 21-step Stouffer Step Tablet at different exposure dosages using a Colight 1630 Exposure Unit; following exposure, the panels were each developed for 60 seconds in a 1.5 percent NaOH solution at 105° F.

| Samples | 400 mJ/cm$^2$ | 300 mJ/cm$^2$ | 200 mJ/cm$^2$ | 150 mJ/cm$^2$ |
|---|---|---|---|---|
| 5 | 3+ to 4– | 3 | 2 | 0 |
| 6 | 4+ to 5– | 3+ to 4– | 2+ | 0 |
| 7 | 5– | 4 | 3– | 2 |
| 8 | 6 | 5 | 4 | 3 |

An SST of 3 to 5, especially 3 to 4, gives the desired resolution and artwork reproduction. Lower SST's indicate an underexposed condition. Slightly higher SST's are acceptable as long as excessive unexposed film loss does not result. Samples 6 through 7 of the present invention gave comparable, if not superior, results as compared with control Sample 5 in most cases. At lower dosages, i.e. 300 to 150 mJ/cm$^2$, results using the present compositions were better.

Whereas particular embodiments of this invention have been described above for purposes of illustration, it will be evident to those skilled in the art that numerous variations of the details of the present invention may be made without departing from the invention as defined in the appended claims.

What is claimed is:

1. A photoresist composition comprising:
A) at least one photoactive polymer comprising a dinitrobenzyl group in the backbone of the polymer, wherein the photoactive polymer is synthesized from monomers

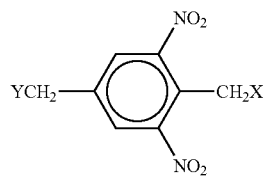

comprising those having the structure:

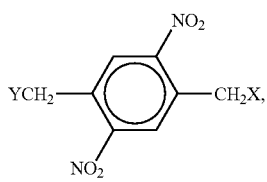

wherein X and Y may be the same or different and are selected from halogen, —OH, —OR, —O—SO$_3$, —SR, and —NRR', wherein R and R' may be the same or different and are selected from substituted or unsubstituted alkyl, aryl, and aralkyl substituents; and
B) at least one photoacid generator.

2. A photoresist composition comprising:
A) at least one photoactive polymer comprising a dinitrobenzyl group; and B) at least one photoacid generator comprising a diazide group,
wherein the photoactive polymer is synthesized from monomers comprising

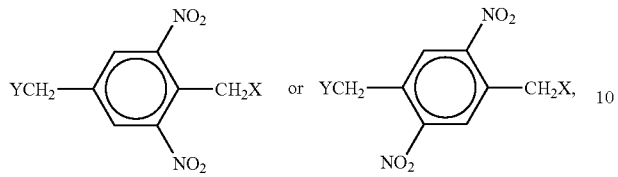

those having the structure:
wherein X and Y may be the same or different and are selected from halogen, —OH, —OR, —O—SO₃R, —SR, and —NRR', wherein R and R' may be the same or different and are selected from substituted or unsubstituted alkyl, aryl, and aralkyl substituents.

3. A photoresist composition comprising:
A) at least one photoactive polymer comprising a dinitrobenzyl group; and
B) at least one photoacid generator, wherein the photoacid generator comprises a sulfonyl aceto carbonyl compound.

4. The composition of claim 1, wherein components A and B are admixed.

5. The composition of claim 4, wherein component B is added to component A after polymerization of the monomers that comprise component A.

6. The composition of claim 4, wherein component B is added to the monomers comprising component A before or during polymerization of said monomers.

7. A photoresist composition comprising:
A) at least one photoactive polymer comprising a dinitrobenzyl group; and
B) at least one photoacid generator wherein A and B are copolymerized.

8. The composition of claim 1, wherein the photoacid generator is present in a weight percent of 10 or less, with weight percent being based on total solids.

9. The composition of claim 8, wherein the photoacid generator is present in a weight percent of 6 or less, with weight percent being based on total solids.

10. The composition of claim 3, wherein the photoacid generator comprises 2-(phenylsulfonyl) acetophenone.

11. The composition of claim 1, wherein there is substantially no dissolution inhibitor in the composition.

12. A method for reducing process time in a positive photoresist comprising incorporating into said photoresist the composition of claim 1; applying said photoresist to a substrate; exposing the substrate to actinic radiation; and developing the substrate; wherein the clear time is less than the clear time when using the photoresist without the composition of claim 1.

13. The method of claim 12, wherein said process time is reduced by 25 percent or more as compared with a composition comprising at least one photoactive polymer comprising a dinitrobenzyl group but lacking at least one photoacid generator.

14. A positive photoresist having a Stouffer Step Table reading of 3 to 5 following an exposure time of 16 seconds or less and a clear time of 60 seconds or less.

15. The positive photoresist of claim 14, wherein the 4×UFL value is less than 10 percent.

16. The positive photoresist of claim 14, wherein the exposure achieves a dosage of 300 mJ/cm² or less.

17. The positive photoresist of claim 16, wherein the exposure achieves a dosage of 250 mJ/cm² or less.

18. A photoresist composition comprising:
A) a positive-acting photoactive polymer comprising a dinitrobenzyl group, wherein the polymer is synthesized from monomers comprising those having the structure;

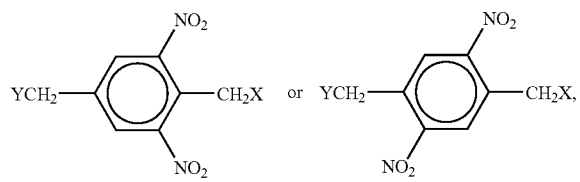

wherein X and Y may be the same or different and are selected from halogen, —OH, —OR, —O—SO₃R, —SR, and —NRR', wherein R and R' are the same or different and are selected from substituted or unsubstituted alkyl, aryl, and aralkyl substituents; and
B) a diazide;
wherein the photoactive polymer does not comprise polyamide and/or polyimide.

19. The photoresist composition of claim 18, wherein the diazide comprises 2-diazo-1-naphthol-4-sulfonic acid.

20. The photoresist composition of claim 1, wherein the photoactive polymer is synthesized from monomers comprising those having the structure

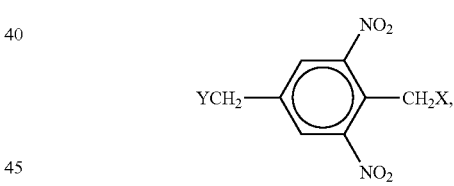

wherein X and Y are the same or different and are either halogen or hydroxy groups.

21. The photoresist composition of claim 2, wherein the photoactive polymer is synthesized from monomers comprising those having the structure

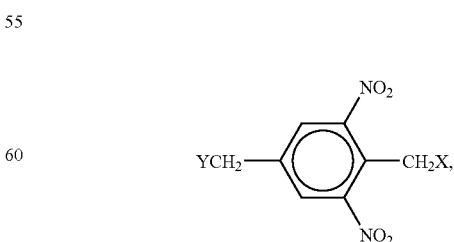

wherein X and Y are the same or different and are either halogen or hydroxy groups.

22. The photoresist composition of claim 3, wherein the photoactive polymer is synthesized from monomers comprising those having the structure:

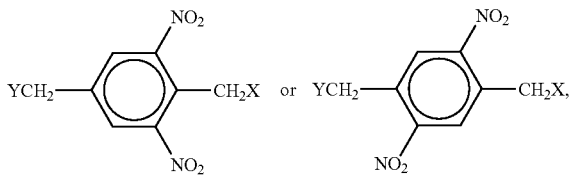

wherein X and Y are the same or different and are selected from halogen, —OH, —OR, —O—SO₃R, —SR, and —NRR', wherein R and R' are the same or different and are selected from substituted or unsubstituted alkyl, aryl, and aralkyl substituents.

23. The photoresist composition of claim 22, wherein the photoactive polymer is synthesized from monomers comprising those having the structure

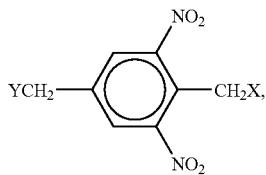

wherein X and Y are the same or different and are either halogen or hydroxy groups.

24. The photoresist composition of claim 18, wherein the photoactive polymer is synthesized from monomers comprising those having the structure wherein X and Y are the same or different and are either halogen or hydroxy groups.

* * * * *